(12) United States Patent
Yu et al.

(10) Patent No.: US 9,525,031 B2
(45) Date of Patent: Dec. 20, 2016

(54) EPITAXIAL CHANNEL

(71) Applicant: Taiwan Semiconductor Manufacturing Co., Ltd., Hsin-Chu (TW)

(72) Inventors: Tsung-Hsing Yu, Taipei (TW); Ken-Ichi Goto, Hsin-Chu (TW); Chia-Wen Liu, Taipei (TW); Yeh Hsu, Guishan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/208,353

(22) Filed: Mar. 13, 2014

(65) Prior Publication Data

US 2015/0263096 A1 Sep. 17, 2015

(51) Int. Cl.
*H01L 29/165* (2006.01)
*H01L 29/10* (2006.01)
(Continued)

(52) U.S. Cl.
CPC ........... *H01L 29/165* (2013.01); *H01L 29/105* (2013.01); *H01L 29/1054* (2013.01);
(Continued)

(58) Field of Classification Search
CPC ............. H01L 29/1054; H01L 29/7849; H01L 29/165; H01L 29/161; H01L 29/66651
See application file for complete search history.

(56) References Cited

U.S. PATENT DOCUMENTS 5,355,006 A 10/1994 Iguchi
5,561,302 A 10/1996 Candelaria
(Continued)

FOREIGN PATENT DOCUMENTS

| KR | 20100080159 A | 7/2010 |
|---|---|---|
| KR | 20130049540 A | 5/2013 |
| TW | 201349304 A | 12/2013 |

OTHER PUBLICATIONS

Chih-Cheng Lu, et al.; "Strained Silicon Technology: Mobility Enhancement and Improved Short Channel Effect Performance by Stress Memorization Technique on nFET Devices"; Journal of the Electrochemical Society; Oct. 8, 2009, p. 1-4.

(Continued)

*Primary Examiner* — Bac Au
*Assistant Examiner* — Toniae Thomas
(74) *Attorney, Agent, or Firm* — Eschweiler & Associates, LLC

(57) ABSTRACT

Some embodiments of the present disclosure relate to an epitaxially grown replacement channel region within a transistor, which mitigates the variations within the channel of the transistor due to fluctuations in the manufacturing processes. The replacement channel region is formed by recessing source/drain and channel regions of the semiconductor substrate, and epitaxially growing a replacement channel region within the recess, which comprises epitaxially growing a lower epitaxial channel region over a bottom surface of the recess, and epitaxially growing an upper epitaxial channel region over a bottom surface of the recess. The lower epitaxial channel region retards dopant back diffusion from the upper epitaxial channel region, resulting in a steep retrograde dopant profile within the replacement channel region. The upper epitaxial channel region increases carrier mobility within the channel. The replacement channel region provides improved drive current, thereby enabling better performance and higher yield.

17 Claims, 11 Drawing Sheets

(51) Int. Cl.
  *H01L 29/66* (2006.01)
  *H01L 29/78* (2006.01)
  *H01L 29/161* (2006.01)
  *H01L 21/02* (2006.01)

(52) U.S. Cl.
  CPC ........ *H01L 29/1083* (2013.01); *H01L 29/161* (2013.01); *H01L 29/6659* (2013.01); *H01L 29/66651* (2013.01); *H01L 29/7833* (2013.01); *H01L 21/02529* (2013.01); *H01L 21/02532* (2013.01); *H01L 21/02535* (2013.01)

(56) References Cited

U.S. PATENT DOCUMENTS

| | | |
|---|---|---|
| 6,040,208 A | 3/2000 | Honeycutt et al. |
| 6,215,148 B1 | 4/2001 | Eitan |
| 6,541,343 B1 | 4/2003 | Murthy et al. |
| 6,566,204 B1 | 5/2003 | Wang et al. |
| 6,589,847 B1 | 7/2003 | Kadosh et al. |
| 6,849,890 B2 | 2/2005 | Kokubun |
| 7,276,407 B2 | 10/2007 | Yamagata et al. |
| 7,507,999 B2 | 3/2009 | Kusumoto et al. |
| 7,943,468 B2 | 5/2011 | Curello et al. |
| 7,952,149 B2 | 5/2011 | Dokumaci et al. |
| 8,034,679 B1 | 10/2011 | Bulucea |
| 8,298,895 B1 | 10/2012 | Alptekin |
| 8,404,546 B2 | 3/2013 | Woon et al. |
| 8,557,659 B2 | 10/2013 | Teo et al. |
| 8,569,156 B1 | 10/2013 | Scudder et al. |
| 8,659,054 B2 | 2/2014 | Rim et al. |
| 8,669,615 B1 | 3/2014 | Chang et al. |
| 2002/0033511 A1 | 3/2002 | Babcock et al. |
| 2003/0008484 A1 | 1/2003 | Hook |
| 2003/0075719 A1 | 4/2003 | Sriram |
| 2005/0023535 A1 | 2/2005 | Sriram |
| 2005/0173739 A1 | 8/2005 | Kusumoto et al. |
| 2005/0285212 A1 | 12/2005 | Tolchinsky et al. |
| 2006/0065937 A1 | 3/2006 | Hoffmann et al. |
| 2006/0220098 A1 | 10/2006 | Lee et al. |
| 2007/0190731 A1 | 8/2007 | Chen et al. |
| 2008/0242032 A1 | 10/2008 | Chakravarthi et al. |
| 2009/0289280 A1* | 11/2009 | Zhang ............. H01L 21/823807 257/190 |
| 2010/0317169 A1 | 12/2010 | Sung et al. |
| 2010/0330763 A1 | 12/2010 | Freeman et al. |
| 2011/0079861 A1 | 4/2011 | Shifren et al. |
| 2011/0215376 A1* | 9/2011 | Holt ........................ H01L 29/78 257/192 |
| 2012/0135575 A1 | 5/2012 | Wong et al. |
| 2013/0113041 A1 | 5/2013 | Liu et al. |
| 2013/0200455 A1 | 8/2013 | Lo et al. |
| 2014/0197411 A1 | 7/2014 | Vakada et al. |
| 2014/0252504 A1 | 9/2014 | Chuang et al. |
| 2015/0243759 A1 | 8/2015 | Huang et al. |
| 2015/0263092 A1* | 9/2015 | Hsiao .................... H01L 29/165 257/77 |

OTHER PUBLICATIONS

S. Flachowsky, et al.; "Stress Memorization Technique for n-MOSFETs: Where is the Stress Memorized?"; ULIS 2010—Ultimate Integration on Silicon; University of Glasgow; Mar. 2010; p. 1-4.
Nuo Xu; "Effectiveness of Strain Solutions for Next-Generation MOSFETs"; University of California—Berkley; Spring 2012; p. 1-103.
Shen, et al. "Molecular Dynamic Simulation Study of Stress Memorization in Si Dislocations." IEEE International Conference: Electron Devices Meeting (IEDM), 2012.
U.S. Appl. No. 13/288,201, filed Nov. 3, 2011.
U.S. Appl. No. 14/252,147, filed Apr. 14, 2014.
Non Final Office Action Dated May 15, 2015 U.S. Appl. No. 14/156,515.
Notice of Allowance Dated Jul. 24, 2015 U.S. Appl. No. 14/252,147.
Streetman, et al. "Solid State Electronic Devices." Fifth Edition. Published in 2000. pp. 311-315.
U.S. Appl. No. 14/156,505, filed Jan. 16, 2014. 23 Pages.
U.S. Appl. No. 14/156,515, filed Jan. 16, 2014. 31 Pages.
U.S. Appl. No. 14/156,546, filed Jan. 16, 2014. 29 Pages.
U.S. Appl. No. 14/156,496, filed Jan. 16, 2014. 27 Pages.
Notice of Allowance dated Jun. 26, 2015 for U.S. Appl. No. 14/156,546.
Notice of Allowance Dated Sep. 9, 2015 U.S. Appl. No. 14/156,505.
Non Final Office Action Dated Nov. 27, 2015 U.S. Appl. No. 14/156,496.
Notice of Allowance Dated Aug. 27, 2015 U.S. Appl. No. 14/156,515.
Non Final Office Action Dated Feb. 23, 2015 U.S. Appl. No. 14/156,546.
Non Final Office Action Dated Apr. 14, 2016 U.S. Appl. No. 14/880,469.

* cited by examiner

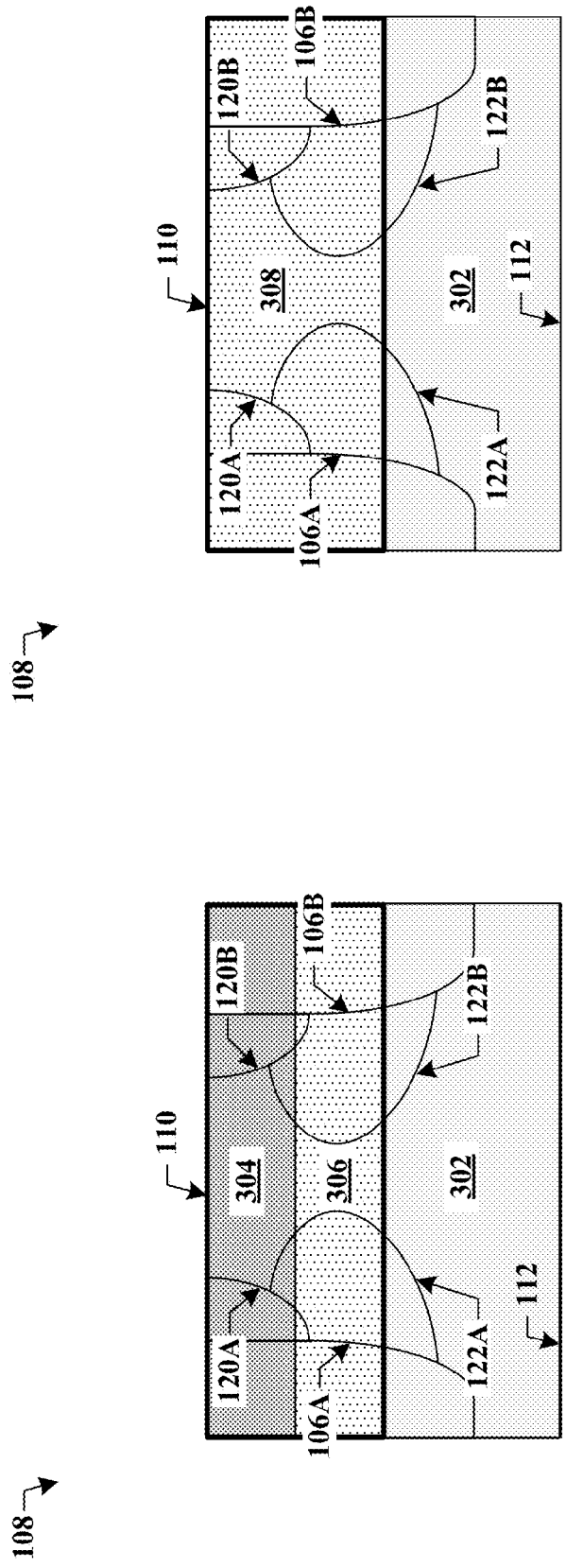

EPITAXIAL CHANNEL

BACKGROUND

The following disclosure relates to a semiconductor device and method of manufacturing the same.

A modern integrated circuit (IC) contains millions or even billions of transistors, which are utilized for amplifying or switching electronic signals, etc. Performance and yield of the IC is dependent upon matching physical and electronic properties of the transistors. As the minimum gate length of the transistors continues to scale in advanced technology nodes, variation substrate properties, transistor dimensions, doping concentration, etc., can create an electronic mismatch between transistors within the IC. These effects can degrade device performance and reduce yield of the IC.

A multitude of separate processing operations are used in semiconductor manufacturing to form the structural features of transistors of the IC. Fluctuations within any of these processing operations can lead to variations in the physical and electronic properties of the transistors. These processing operations include mask alignment, optical lithography, etching, implanting dopants, layer depositions, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2D, 3A-3B, and 4A-4B illustrate cross-sectional views of a replacement channel region formed within the transistor of FIGS. 1A-1B.

DETAILED DESCRIPTION

Figure 1A:
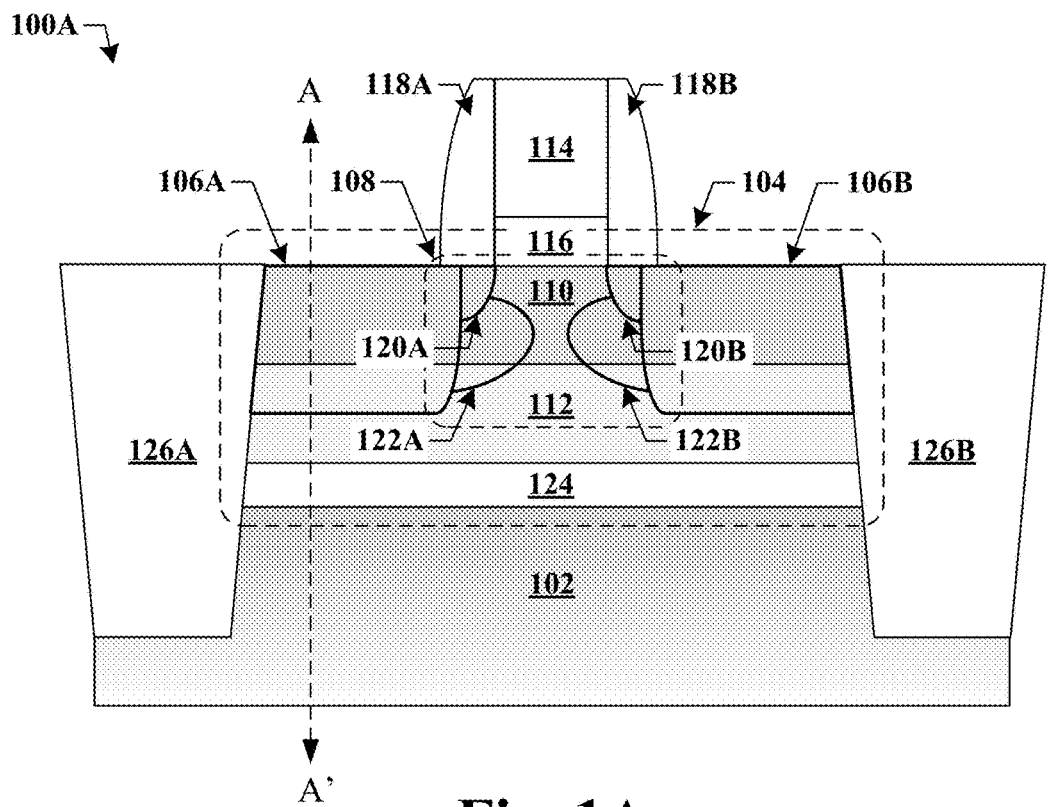
FIGS. 1A-1B illustrate a cross-sectional view and dopant concentration profile of a transistor of the present disclosure.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "on," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Manufacturing a modern integrated circuit (IC) includes a number of separate processing operations including forming an active region of transistors in a semiconductor substrate, forming source/drain regions in the active region, and forming a channel region that separates the source/drain regions from one another. These processing operations include thermal cycling (i.e., heating and cooling) of the semiconductor substrate though annealing, implanting dopants impurities in the transistor channel, pocket implant regions, and the source/drain regions, etc., which degrades crystal structure, introduces impurities, etc., into the semiconductor substrate. Variations in the implant conditions (e.g., dose, energy, angle, etc.) can also cause variation in transistor properties, particularly within the channel of the transistor. These properties include dopant concentration, carrier mobility, effective mass, etc. Variation of these properties between the transistors of the IC causes variations in their drive current, and consequently reduces performance and yield of the IC. It would therefore be desirable to provide transistors with well-controlled channel properties.

Accordingly, some embodiments of the present disclosure relate to semiconductor manufacturing techniques that utilize an epitaxially grown replacement channel region within a transistor. The replacement channel region mitigates the variations within the channel due to fluctuations in the manufacturing processes. The replacement channel region is formed by recessing the source/drain and channel regions of the semiconductor substrate, and epitaxially growing a replacement channel region within the recess. Growing the replacement channel region comprises epitaxially growing a lower epitaxial channel region over a bottom surface of the recess, and epitaxially growing an upper epitaxial channel region over a bottom surface of the recess. The lower epitaxial channel region is configured to retard dopant back diffusion from the upper epitaxial channel region, resulting in a steep retrograde dopant profile within the replacement channel region, which increases mobility within the replacement channel region. Transistors with the replacement channel region exhibit improved drive current variation within the substrate, between substrates within a process lot, and between process lots than those formed by conventional processes, thereby enabling better performance and higher yield.

FIG. 1A illustrates a cross-sectional view of a transistor 100A, which can be formed on an integrated circuit (IC) in accordance with some embodiments. The transistor 100A is formed on an active region 104 of a semiconductor substrate 102, wherein the active region 104 has a first conductivity type (e.g., p-type). Source/drain regions 106A, 106B, which have a second conductivity type (e.g., n-type), are arranged in the semiconductor substrate 102. A replacement channel region 108, which has the first conductivity type (e.g., p-type), is arranged in the semiconductor substrate 102 so as to laterally space the source/drain regions 106A, 106B from one another. A gate structure is arranged over the replacement channel region 108, and includes a conductive gate electrode 114 formed over a gate dielectric 116, which separates the conductive electrode 114 from the replacement channel region 108. Sidewall spacers 118A, 118B reside about opposing sidewalls of the gate structure. Lightly doped drain (LDD) regions 120A, 120B, which have the second conductivity type (e.g., n-type), halo implant regions 122A, 122B which can have the first conductivity type (e.g., p-type), and isolation structures 126A, 126B (e.g., shallow trench isolations (STIs)) can also be present in some implementations.

The replacement channel region 108 comprises an upper epitaxial channel region 110 and a lower epitaxial channel region 112. The replacement channel region 108 is configured such that charge carriers (e.g., electrons) within the upper epitaxial channel region 110 have a reduced effective mass than in a channel formed by conventional methods. In some embodiments, the effective mass of the charge carriers can be reduced by several orders of magnitude. The lower epitaxial channel region 112 is configured to retard dopant back diffusion from the upper epitaxial channel region 110, resulting in a steep retrograde dopant profile within the replacement channel region 108, as will be illustrated in FIG. 1B. The reduced effective mass of charge carriers in the upper epitaxial channel region 110 has an effect of increasing the mobility of the charge carriers compared to a channel formed by conventional methods. This, along with the steep retrograde dopant profile formed by the lower epitaxial channel region 112 improves the drive current of the transistor 100A compared to one formed by conventional methods.

Figure 1B:
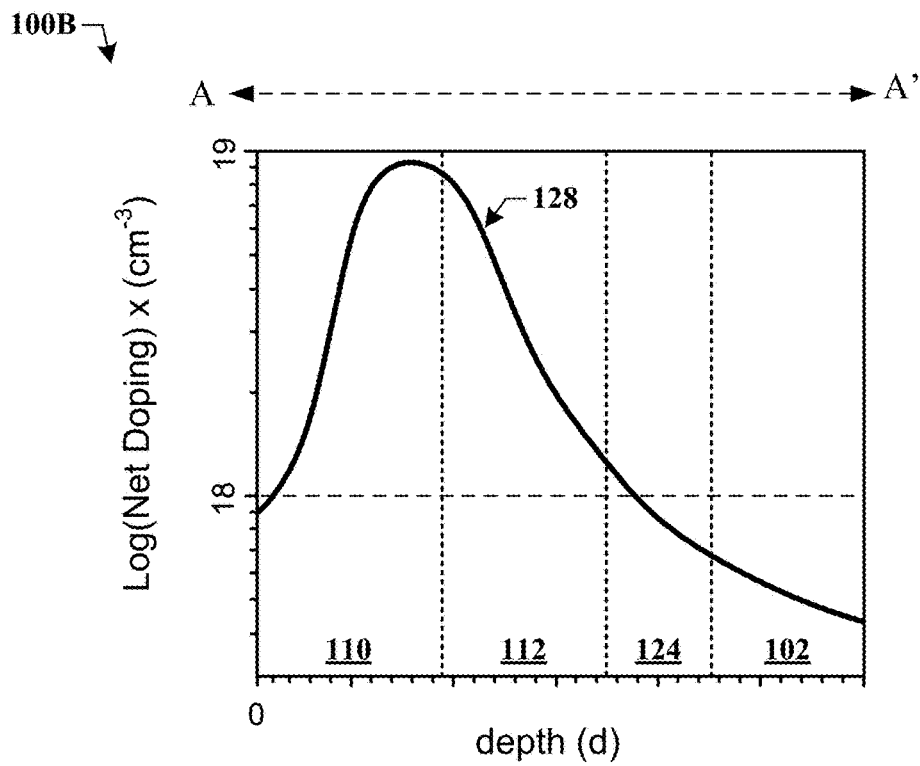

FIG. 1B illustrates a graph 100B of a dopant concentration profile 128 of the replacement channel region 108 of the transistor 100A, along cross-section AA', as a function of depth (d) from a top surface of the upper epitaxial channel region 110. The dopant concentration profile 128 comprises a retrograde dopant concentration profile, which exhibits a peak dopant concentration of about 1e19 cm$^{-3}$ within the upper epitaxial channel region 110, and is less than 1e18 cm$^{-3}$ at the top surface of the upper epitaxial channel region 110 at an interface with the gate dielectric 116 (i.e., d=0). The steep slope of the retrograde dopant concentration profile 128 indicates that the lower epitaxial channel region 112 prevents back diffusion of dopants from the upper epitaxial channel region 110. This improves the gain of the transistor 100A over some conventional approaches. The retrograde dopant concentration profile 128 peaks within the upper epitaxial channel region 110 and tails off to less than 1e18 cm$^{-3}$ semiconductor substrate 102 to reduce leakage current ($I_{boff}$) within the replacement channel region 108.

Several materials configurations can be used to manufacture the replacement channel region 108 of FIGS. 1A-1B. FIGS. 2A-2D illustrate various embodiments of a replacement channel region 108 comprising an upper epitaxial channel region 110 of silicon (Si) 202, and a lower epitaxial channel region 112 configured to retard dopant back diffusion from the upper epitaxial channel region 110. The lower epitaxial channel region 112 comprises various combinations of germanium-tin ($Ge_{1-x}Sn_x$), silicon-germanium ($Si_{1-x}Ge_x$), or carbon-doped silicon-germanium ($Si_{1-x}Ge_xC_y$). Mole fractions x and y are in a range of greater than 0 and less than 1. For FIGS. 2A-2D, x is in a range of about 0.1 to about 0.5 and y is in a range of about 0.001 to about 0.01.

Figure 2A:
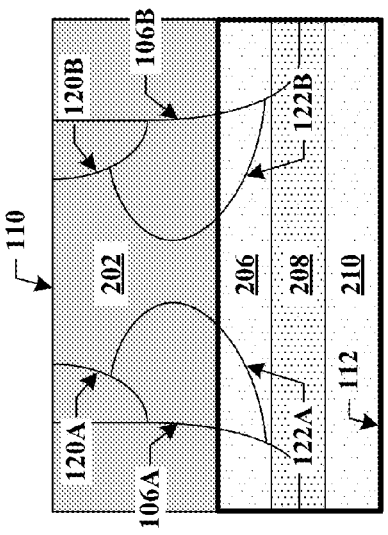

The replacement channel region 108 of FIG. 2A comprises a lower epitaxial channel region 112 comprising a single layer 204 of $Ge_{1-x}Sn_x$, $Si_{1-x}Ge_x$, or $Si_{1-x}Ge_xC_y$.

Figure 2B:
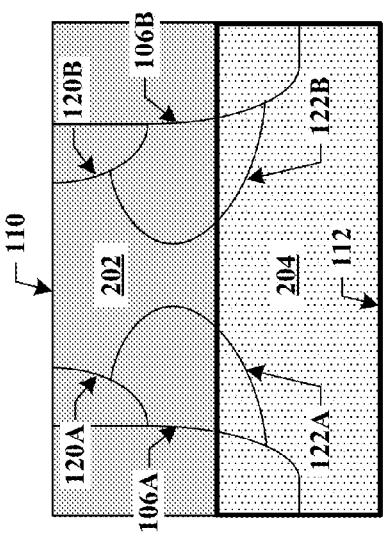

The replacement channel region 108 of FIG. 2B comprises a lower epitaxial channel region 112 comprising a top lower epitaxial channel layer 206 comprising $Si_{1-x}Ge_x$, formed over a middle lower epitaxial channel layer 208 comprising silicon-carbide (SiC), formed over a bottom lower epitaxial channel layer 210 comprising $Si_{1-x}Ge_x$.

Figure 2C:
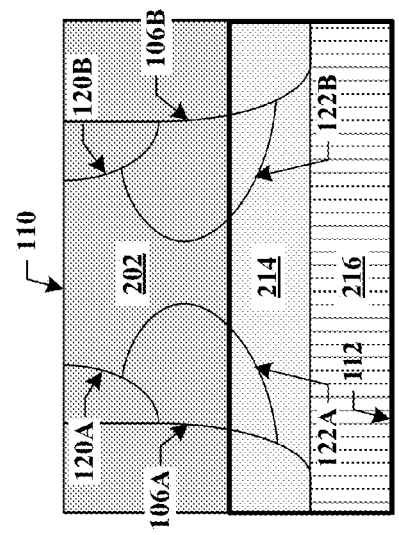

The replacement channel region 108 of FIG. 2C comprises a lower epitaxial channel region 112 comprising comprises a top lower epitaxial channel layer 206 comprising $Si_{1-x}Ge_x$, formed over a middle lower epitaxial channel layer 212 comprising $Si_{1-x}Ge_xC_y$, formed over a bottom lower epitaxial channel layer 210 comprising $Si_{1-x}Ge_x$.

Figure 2D:
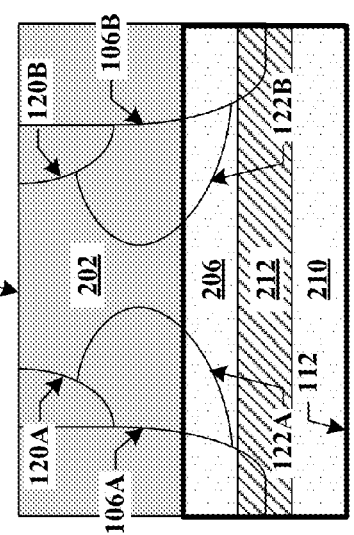

The replacement channel region 108 of FIG. 2D comprises a lower epitaxial channel region 112 comprising a top lower epitaxial channel layer 214 comprising $Ge_{1-x}Sn_x$ formed over a bottom lower epitaxial channel layer 216 comprising germanium (Ge).

FIGS. 3A-3B illustrate various embodiments of a replacement channel region 108 comprising an upper epitaxial channel region 110 configured for increased mobility relative to a channel formed by conventional techniques. The replacement channel region 108 comprises a lower epitaxial channel region 112 of Ge 302 configured to retard dopant back diffusion. The upper epitaxial channel region comprises germanium (Ge) or germanium-tin ($Ge_{1-x}Sn_x$). Mole fractions x and y are in a range of greater than 0 and less than 1.

The replacement channel region 108 of FIG. 3A comprises an upper epitaxial channel region 110 comprising a top upper epitaxial channel layer 304 comprising germanium (Ge) formed over a bottom upper epitaxial channel layer 306 comprising $Ge_{1-x}Sn_x$, wherein x is in a range of about 0.1 to about 0.5.

The replacement channel region 108 of FIG. 3B comprises an upper epitaxial channel region 110 comprising a single layer of germanium-tin ($Ge_{1-x}Sn_x$), wherein x is in a range of about 0.1 to about 0.5.

The use of germanium-tin ($Ge_{1-x}Sn_x$) within the upper epitaxial channel region 110 increases drive current of the transistor by decreasing the effective mass (m*) of charge carriers (i.e., electrons) to a value less than the effective mass of electrons within pure silicon (i.e., m*/m$_e$=0.19, where m$_e$=9.11×10−31 kg is the mass of an unbound electron). In some embodiments, where the upper epitaxial channel region 110 comprises $Ge_{1-x}Sn_x$, the effective mass (m*) of charge carriers within the upper epitaxial channel region 110 is about, which is about two order of magnitude less than the effective mass of Si. Therefore, because the mobility (μ) of charge carriers is inversely-proportional to their effective mass:

$$\mu = \frac{e\langle\tau\rangle}{m*},$$

and the drive current (I) is proportional to the mobility:

I=nqμE, the drive current (I) increases by about two orders of magnitude for a transistor with a replacement channel region 108 of $Ge_{1-x}Sn_x$ over a transistor that uses a Si channel.

Figure 4B:
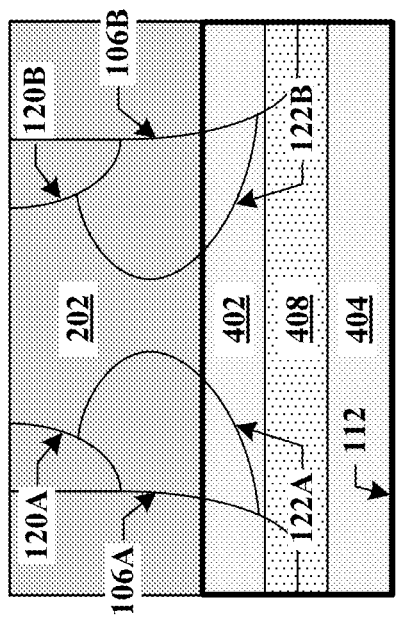
Figure 4A:
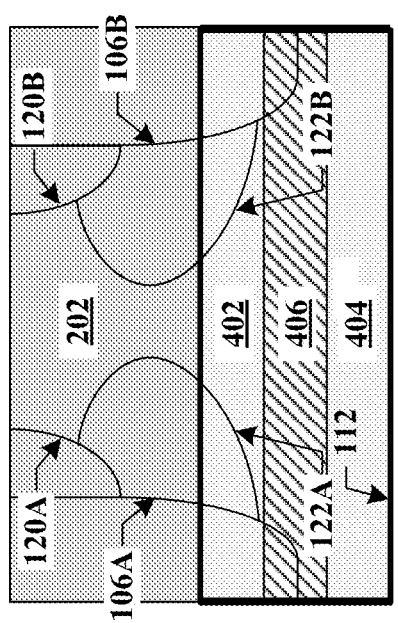

FIGS. 4A-4B illustrate various embodiments of a replacement channel region 108 comprising an upper epitaxial channel region 110 of silicon (Si) 202, and a lower epitaxial channel region 112 configured to retard dopant back diffusion from the upper epitaxial channel region 110. The lower epitaxial channel region 112 comprises various combinations of silicon-carbide ($SiC_y$), phosphorus-doped silicon-carbide ($SiC_y$), and silicon-boride (SiB). The mole fraction y is in a range of about 0.001 to about 0.01.

The replacement channel region 108 of FIG. 4A configured to increase electron mobility in an n-type field-effect transistor (NFET), comprising a lower epitaxial channel region 112 comprising a top and bottom lower epitaxial channel layers 402, 404 comprising $SiC_y$, formed over and below a middle lower epitaxial channel layer 406 comprising SiB. The middle lower epitaxial channel layer 406 is boron-doped in situ with to a boron concentration of less than 5e19 $cm^{-3}$.

The replacement channel region 108 of FIG. 4B configured to increase hole mobility in an a PFET, comprising a lower epitaxial channel region 112 comprising a top and bottom lower epitaxial channel layers 402, 404 comprising $SiC_y$, formed over and below a middle lower epitaxial channel layer 408 comprising $SiCP_y$. The middle lower epitaxial channel layer 408 is phosphorus-doped in situ with to a phosphorus concentration of less than 5e19 $cm^{-3}$.

Figure 5A:
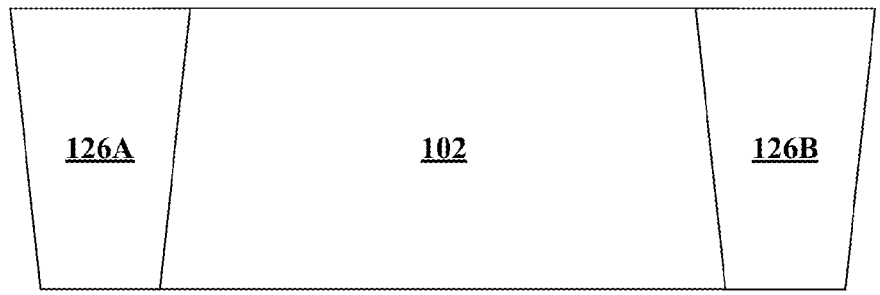
FIGS. 5A-5L illustrates a series of cross-sectional views that collectively depict a method of manufacturing a transistor.

FIGS. 5A-5L illustrates a series of cross-sectional views that collectively depict a method of manufacturing a transistor consistent with FIG. 4's methodology. FIG. 5A illustrates a cross-sectional view of a semiconductor substrate 102. For the embodiments of FIGS. 5A-5L, the semiconductor substrate 102 contains isolation structures 126A, 126B (e.g., STIs). In other embodiments, the semiconductor substrate 102 contains no isolation structures 126A, 126B.

Figure 5B:
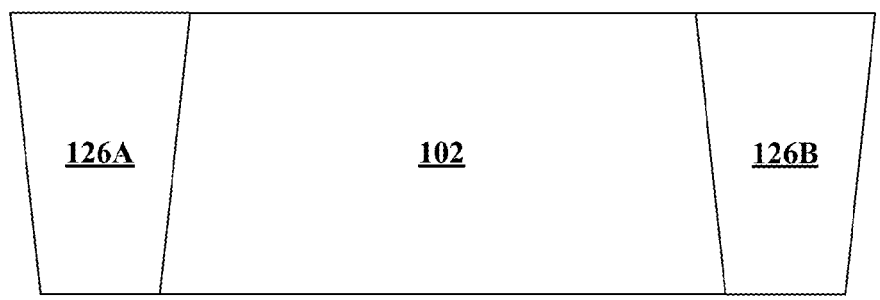

In FIG. 5B, the semiconductor substrate 102 is subjected to a well implant 502, which introduces dopant impurities of a first impurity type (e.g., p-type) into the semiconductor substrate 102. In some embodiments, the dopant impurities include p-type dopant impurities such as boron, carbon, indium, etc. In other embodiments, the dopant impurities include n-type dopant impurities such as phosphorous, antimony, or arsenic, etc.

Figure 5C:
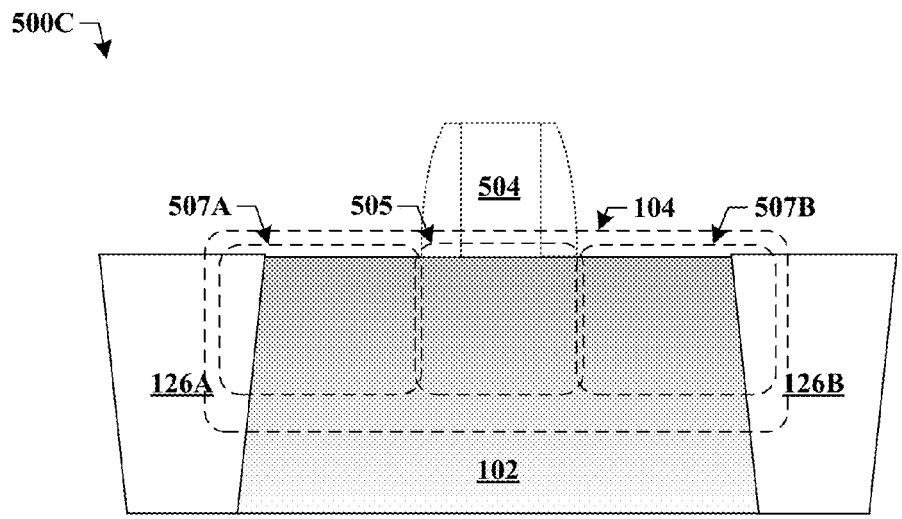

In FIG. 5C, an active region 104 has been formed by annealing the semiconductor substrate 102, which activates the implanted dopants impurities, reduces crystalline defects introduced during the well implant 502, and promotes diffusion and redistribution of dopant impurities within the semiconductor substrate 102. Various conventional annealing operations may be used and the annealing operations may drive the implanted dopant impurities deeper into the semiconductor substrate 102 as indicated by darkness gradient of the semiconductor substrate 102 in FIG. 5C.

In some embodiments, a sacrificial gate 504 is formed over the active region 104 in a replacement metal gate process, which is subsequently removed. After formation of the sacrificial gate 504, a sacrificial source/drain regions 507A, 507B can be identified on either side of the sacrificial gate 504, as well as a sacrificial channel region 505 below the sacrificial gate 504, between the source/drain regions 106A, 106B, or both.

Figure 5D:
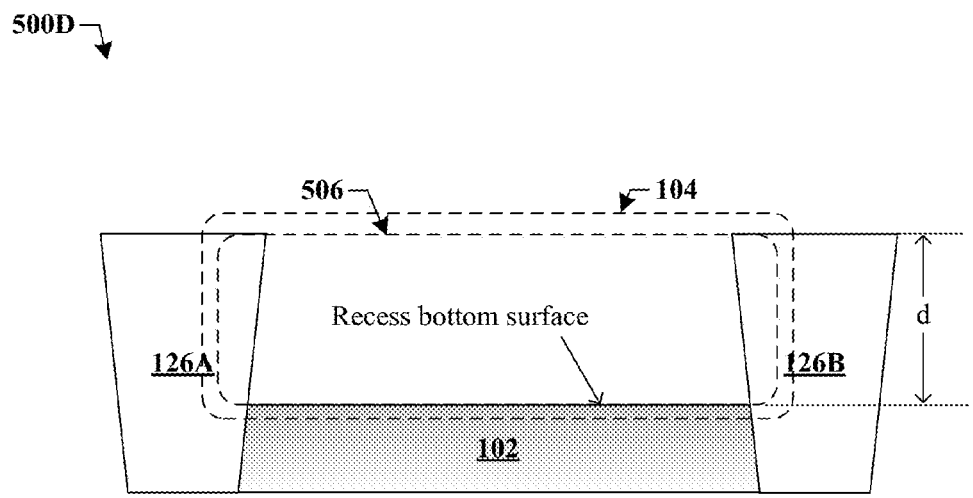

In FIG. 5D the semiconductor substrate 102 has been recessed to a depth (d) in the active region 104. In some embodiments, formation of the recess 506 includes one or more etching process(es), including but not limited to a dry process(es) such as a plasma etching process, wet etching process(es), or a combination thereof. In some embodiments, a photomask patterning process is used to define the lateral extent of the recess.

Figure 5E:
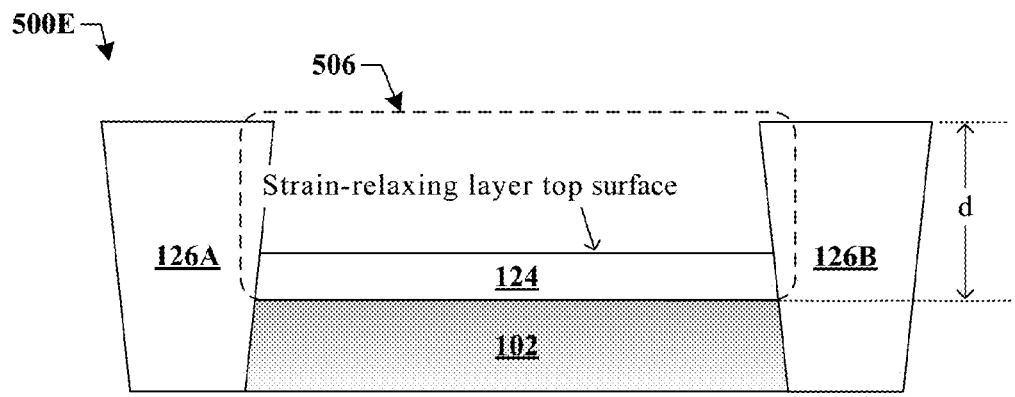

In FIG. 5E a strain-relaxing layer 124 has been formed over a bottom surface of the recess. The strain-relaxing layer is configured to relieve lattice mismatch between the semiconductor substrate 102 and replacement channel region formed in FIGS. 5F-5G. IN some embodiments, the strain-relaxing layer comprises Ge, silicon (Si), or $Si_{1-x}Ge_x$.

Figure 5F:
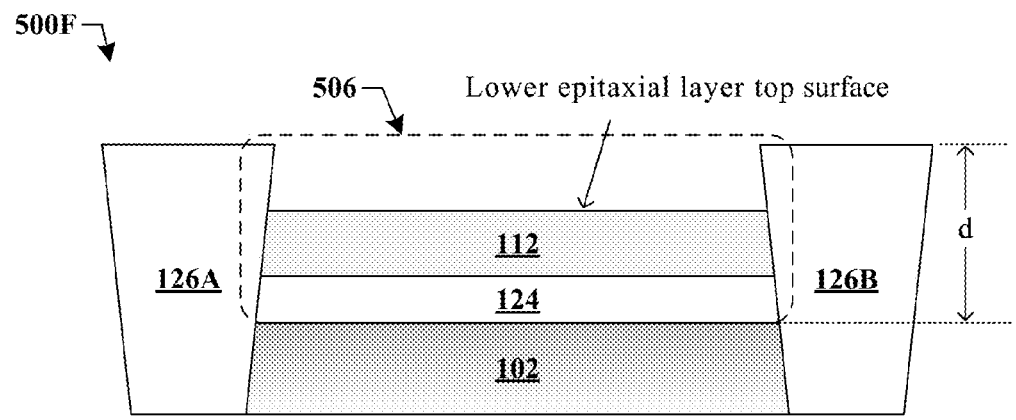

In FIG. 5F a lower epitaxial channel region 112 has been grown over a top surface of the strain-relaxing layer 124. In some embodiments, forming the lower epitaxial channel region comprises epitaxially growing a bottom lower epitaxial channel layer comprising $Si_{1-x}Ge_x$ over a bottom surface of the recess, epitaxially growing a middle lower epitaxial channel layer comprising SiC or $Si_{1-x}Ge_xC_y$ over the bottom lower epitaxial channel layer, and epitaxially growing a top lower epitaxial channel layer comprising $Si_{1-x}Ge_x$ over the middle lower epitaxial channel layer. In some embodiments, forming the lower epitaxial channel region comprises epitaxially growing a bottom lower epitaxial channel layer comprising Ge over a bottom surface of the recess, and epitaxially growing a top lower epitaxial channel layer comprising $Ge_{1-x}Sn_x$ over the bottom lower epitaxial channel layer. Various options for lower epitaxial channel region 112 formation are shown in the embodiments of FIGS. 2A-2D and 3A-3B.

Figure 5G:
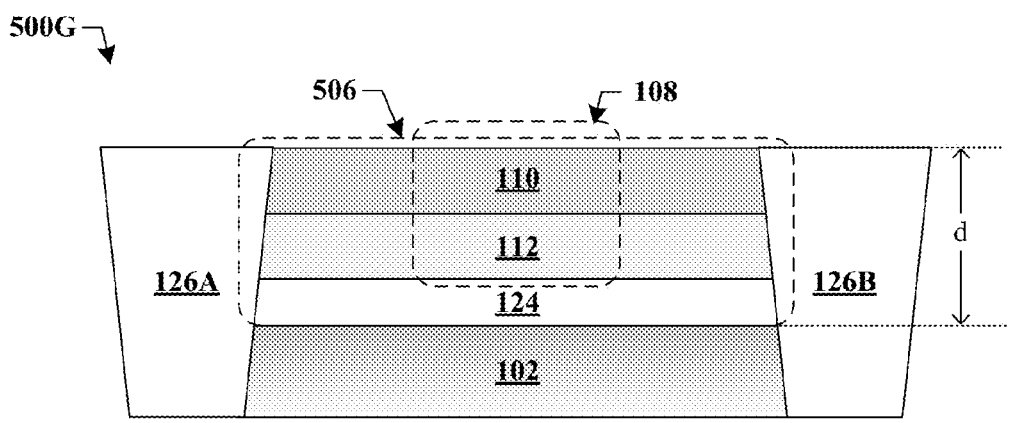

In FIG. 5G an upper epitaxial channel region 110 has been grown over a top surface of the lower epitaxial channel region 112 to complete a replacement channel region 108. In some embodiments, forming the upper epitaxial channel region comprises epitaxially growing a single layer of Si, Ge or $Ge_{1-x}Sn_x$, over the lower epitaxial channel region. In some embodiments, forming the upper epitaxial channel region comprises epitaxially growing the upper epitaxial channel region comprises epitaxially growing a bottom upper epitaxial channel layer comprising $Ge_{1-x}Sn_x$ over a bottom surface of the recess, and epitaxially growing a top upper epitaxial channel layer comprising germanium (Ge) over the bottom lower epitaxial channel layer. Various options for upper epitaxial channel region 110 formation are shown in the embodiments of FIGS. 2A-2D and 3A-3B.

Figure 5H:
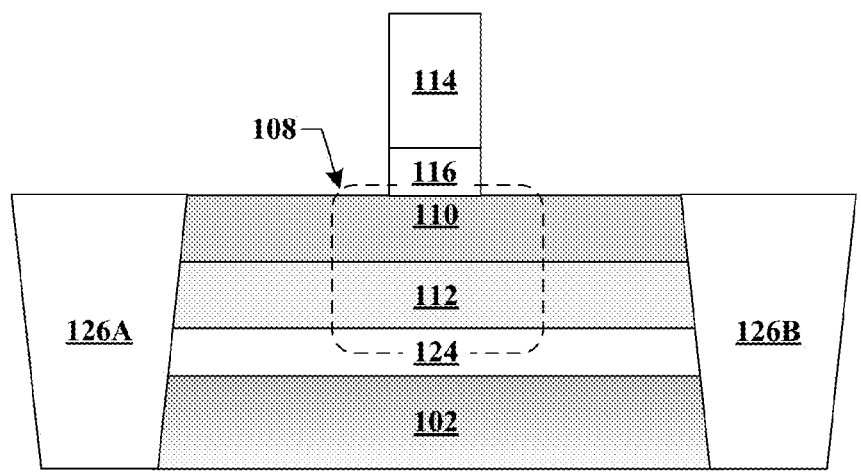

In FIG. 5H a gate dielectric 116 has been formed over the replacement channel region 108. In some embodiments, gate dielectric 116 includes an oxide layer such as silicon dioxide ($SiO_2$). Formation of such an oxide layer utilizes an oxidation process, which is performed at an elevated temperature. It is appreciated that the elevated temperature of the oxidation process may enhance back diffusion of dopant impurities that formed the active region (104) from the semiconductor substrate 102 into the replacement channel region 108. However, the lower epitaxial channel region 112 mitigates such back diffusion from the active region 104 as well as from the upper epitaxial channel region 110, resulting in a steep retrograde doping profile within the replacement channel region 108.

Also in FIG. 5H a gate electrode 114 (e.g., polysilicon) has been formed over the gate dielectric 116. The gate electrode 114 and the gate dielectric 116 are then patterned by a suitable lithography method including, but not limited to, optical lithography, multiple patterning (MP) optical lithography (e.g., double-patterning), deep ultraviolet (UV) lithography, extreme UV (EUV) lithography, or other suitable patterning technique.

Figure 5I:
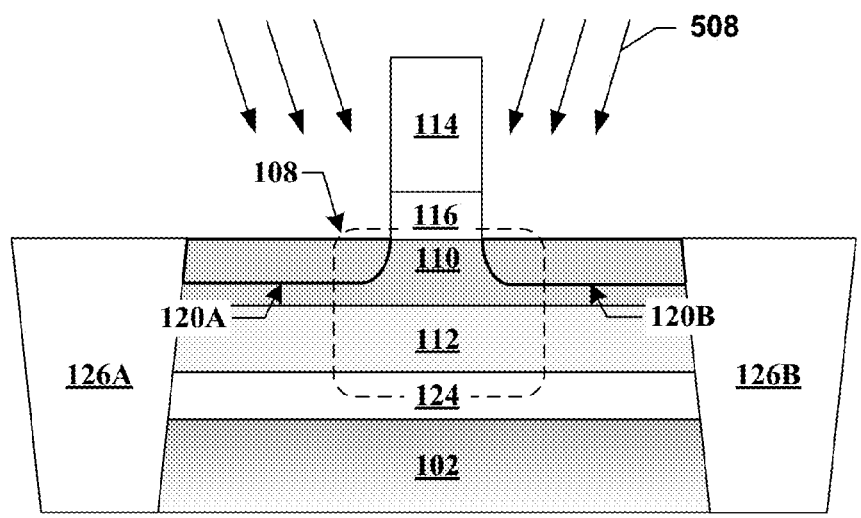

In FIG. 5I a lightly-doped-drain (LDD) implant 508 is performed after patterning of the gate electrode 114 and the gate dielectric 116 to form LDD regions 120A, 120B. The LDD implant 508 utilizes dopants of a second impurity type (e.g., n-type) (e.g., phosphorous, antimony, or arsenic, etc), which is opposite the first impurity type (e.g., p-type) (e.g., boron, carbon, indium, etc.).

Figure 5J:
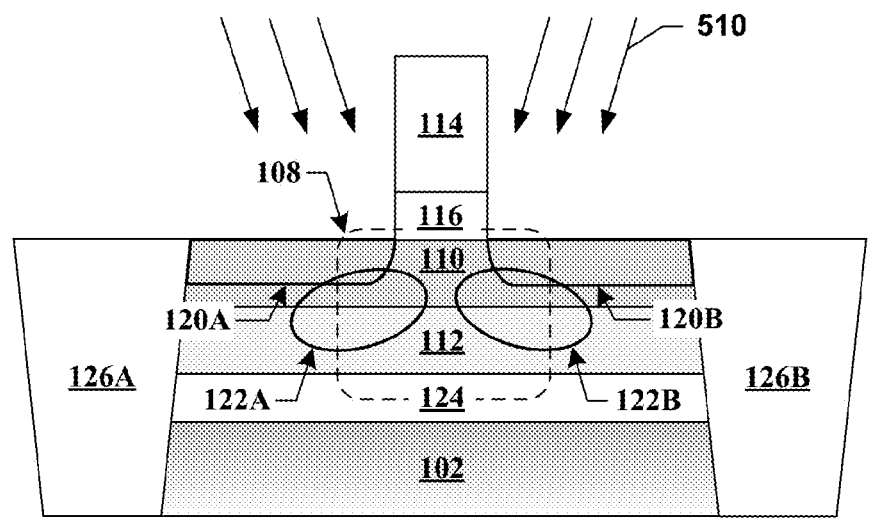

In FIG. 5J a halo implant 510 is performed after the LDD implant 508. The halo implant 510 introduces dopant impurities of the first impurity type (e.g., p-type) into halo implant regions 122A, 122B located on opposite edges the replacement channel region 108. In some embodiments, the halo implant 510 introduces indium, carbon, boron, or $BF_2$, or a combination thereof into the halo implant regions 122A, 122B.

Figure 5K:
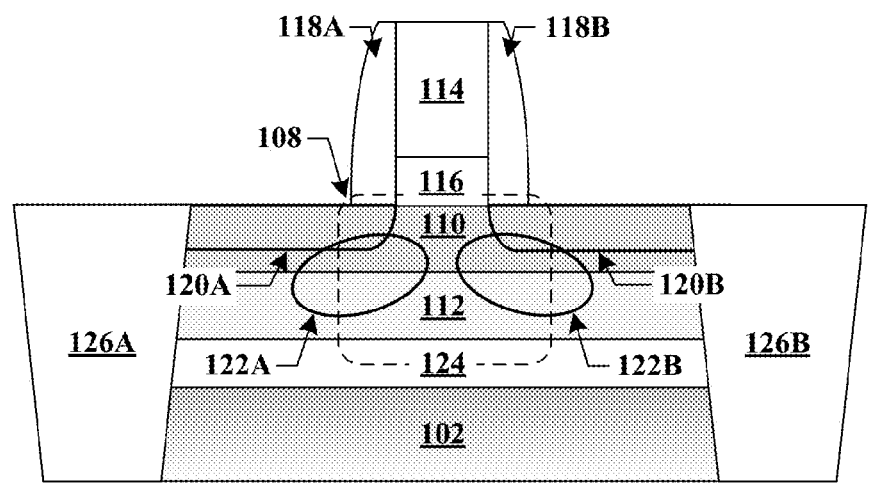

In FIG. 5K sidewall spacers 118A, 118B are formed on either side of the patterned gate electrode 114 and the gate dielectric 116. In various embodiments, the sidewall spacers 118A, 118B include combinations of oxide, silicon, and nitride.

Figure 5L:
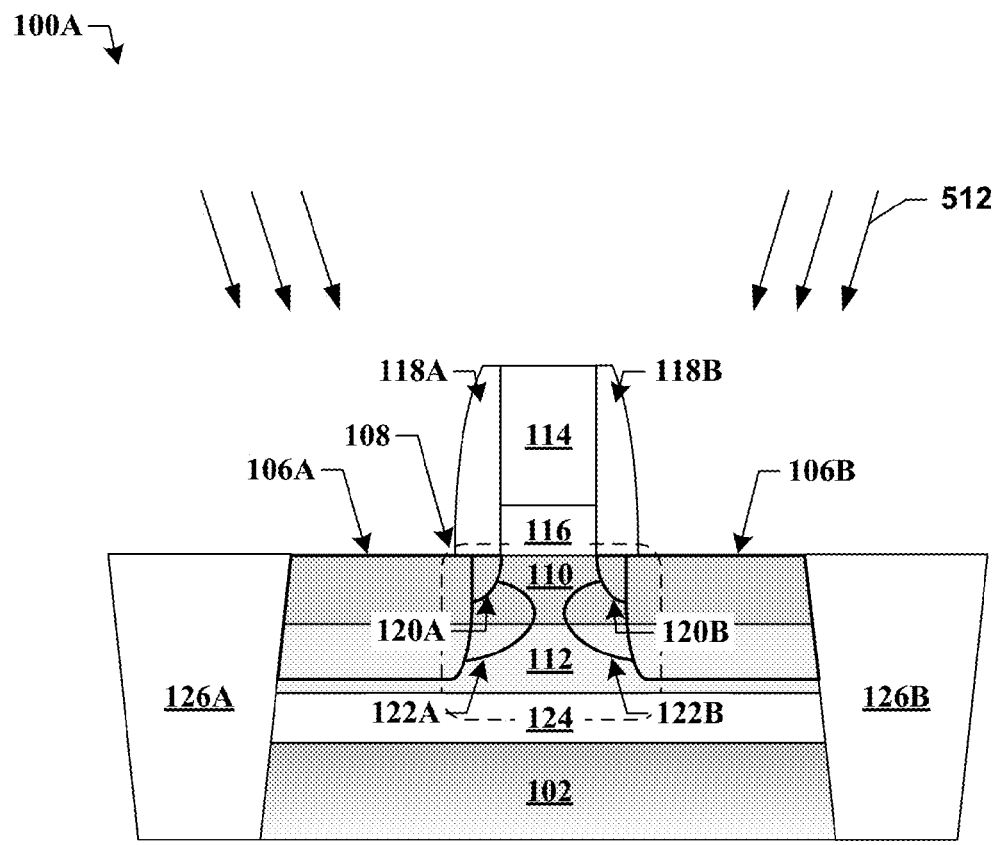

In FIG. 5L a source/drain implant 512 is performed to form source/drains regions 106A, 106B. The source/drains regions 106A, 106B include the second impurity type. In some embodiments, the source/drains regions 106A, 106B are formed by epitaxial growth. Upon completion of the source/drain implant 512, the transistor 100A has been formed. In some embodiments, the source/drain regions 106A, 106B are formed by the epitaxial layers.

Note that the embodiments of FIGS. 5A-5L may apply to a p-type MOSFET or an n-type MOSET by reversing the dopant types.

Figure 6:
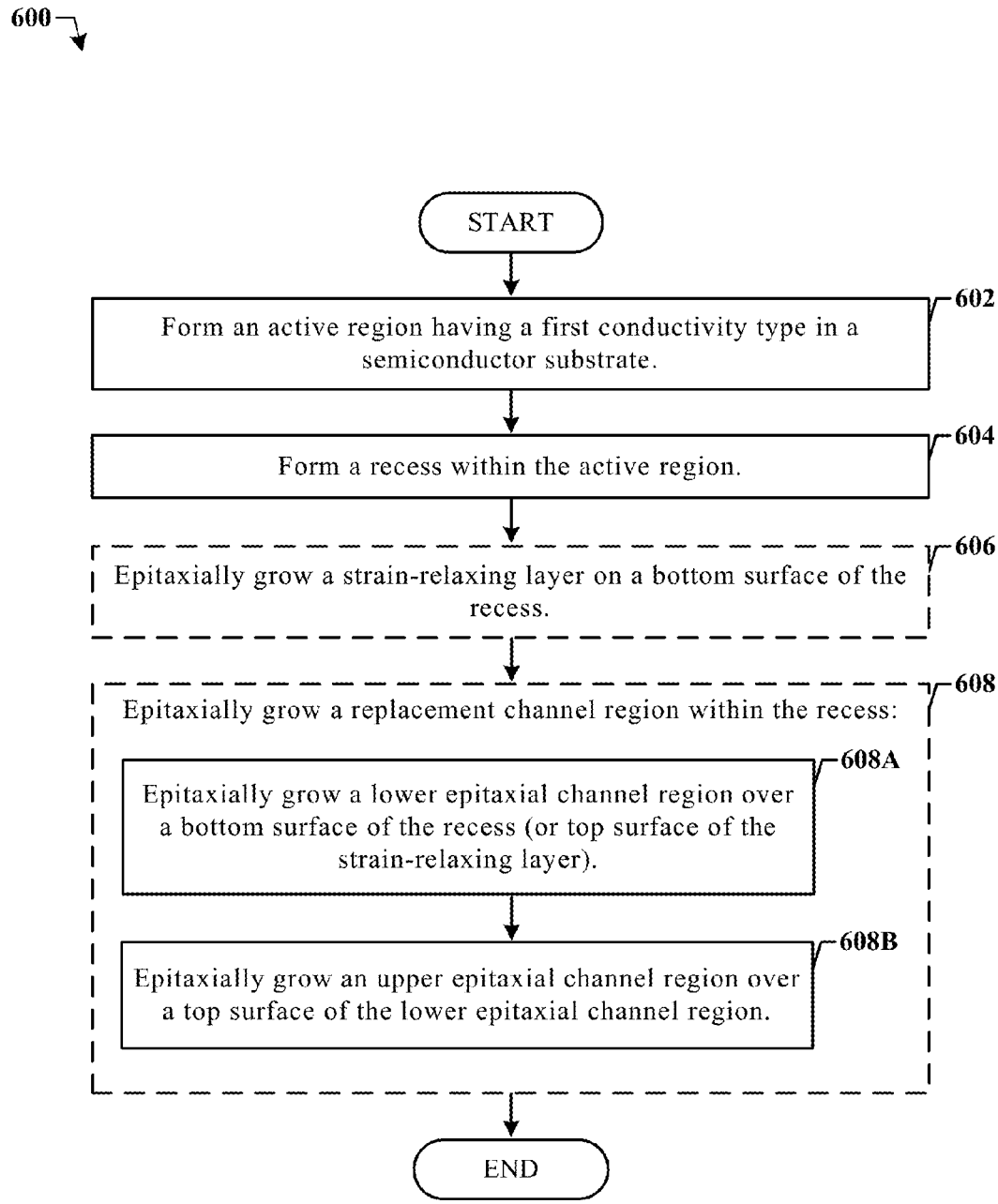
FIG. 6 illustrates a flow diagram of a method of forming a transistor with the replacement channel region.

FIG. 6 illustrates some embodiments of a method 600 of forming a semiconductor transistor.

At 602 an active region is formed having a first conductivity type (e.g., p-type) in a semiconductor substrate. In some embodiments, formation of the active region includes an implant of dopant impurities of the first type into the semiconductor substrate, followed by an anneal.

At 604 a recess is formed within the active region. In some embodiments, the recess is formed by etching the semiconductor substrate.

At 606, a strain-relaxing layer is optionally formed on a bottom surface of the recess. The strain-relaxing layer is configured to have a lattice constant value that is less than (or greater than) a lattice constant value of the semiconductor substrate, and greater than (or less than) a lattice constant value of the replacement channel region. As a result, the strain-relaxing layer relieves lattice mismatch between the semiconductor substrate and replacement channel region, which could result in degradation of the crystal structure and hence a degradation in carrier mobility within the replacement channel region.

At 608 a replacement channel region is epitaxially grown within the recess, (i.e., over a bottom surface of the recess or over a top surface of the strain-relaxing layer, if present). Epitaxially growing the replacement channel region comprises a at least two steps: At 608A a lower epitaxial channel region over a bottom surface is epitaxially grown over the bottom of the recess (or over a top surface of the strain-relaxing layer, if present), and at 608B an upper epitaxial channel region is epitaxially grown over a top surface of the lower epitaxial channel region.

Epitaxially growing the replacement channel region includes one or more epitaxial growth techniques known to one of ordinary skill in the art. In various embodiments, the upper and lower epitaxial channel regions of the replacement channel region comprise various combinations of Si, Ge, SiB, SiC$_y$, SiCP$_y$, Si$_{1-x}$Ge$_x$, Ge$_{1-x}$Sn$_x$, or Si$_{1-x}$Ge$_x$C$_y$ (wherein 0<x or y<1). In some embodiments, the upper or lower epitaxial channel region comprises a single layer (i.e., single crystal). In some embodiments, the upper or lower epitaxial channel region comprises a multiple layers (i.e., a heterostructure comprising multiple crystal layers stacked over one-another).

Therefore, some embodiments of the present disclosure relate to semiconductor manufacturing techniques that utilize an epitaxially grown replacement channel region within a transistor. The replacement channel region mitigates the variations within the channel due to fluctuations in the manufacturing processes. The replacement channel region is formed by recessing the source/drain and channel regions of the semiconductor substrate, and epitaxially growing a replacement channel region within the recess. Growing the replacement channel region comprises epitaxially growing a lower epitaxial channel region over a bottom surface of the recess, and epitaxially growing an upper epitaxial channel region over a bottom surface of the recess. The lower epitaxial channel region is configured to retard dopant back diffusion from the upper epitaxial channel region, resulting in a steep retrograde dopant profile within the replacement channel region, which increases mobility within the replacement channel region. Transistors with the replacement channel region exhibit improved drive current variation between transistors within the substrate, between substrates within a process lot, and between process lots than those formed by conventional processes, thereby enabling better performance and higher yield.

In some embodiments, the present disclosure relates to a semiconductor device, comprising a semiconductor substrate comprising an active region having a first conductivity type, and source/drain regions having a second conductivity type arranged in the active region. A replacement channel region is arranged laterally between the source/drain regions, the replacement channel region comprising an upper epitaxial channel region and a lower epitaxial channel region, wherein the lower epitaxial channel region comprises germanium-tin (Ge$_{1-x}$Sn$_x$), silicon-germanium (Si$_{1-x}$Ge$_x$), or carbon-doped silicon-germanium (Si$_{1-x}$Ge$_x$C$_y$), and wherein x and y are in a range of greater than 0 and less than 1. A gate structure is arranged over the replacement channel region. The gate structure includes a conductive gate electrode and a gate dielectric, which separates the gate conductive electrode from the replacement channel region.

In some embodiments, the present disclosure relates to a semiconductor device, comprising a semiconductor substrate comprising an active region having a first conductivity type, and source/drain regions having a second conductivity type arranged in the active region. A replacement channel region is arranged laterally between the source/drain regions, the replacement channel region comprising an upper epitaxial channel region and a lower epitaxial channel region, wherein the upper epitaxial channel region comprises germanium (Ge) or germanium-tin (Ge$_{1-x}$Sn$_x$), and wherein x is in a range of greater than 0 to less than 1. A gate structure id arranged over the replacement channel region. The gate structure includes a conductive gate electrode and a gate dielectric, which separates the conductive electrode from the replacement channel region.

In some embodiments, the present disclosure relates to a method, comprising forming an active region having a first conductivity type in a semiconductor substrate, forming source/drain regions having a second conductivity type in the active region, and forming a channel region that separates the source/drain regions from one another. The method further comprises forming a recess within the source/drain and channel regions, and epitaxially growing a replacement channel region within the recess, comprising. Epitaxially growing a replacement channel region comprises epitaxially growing a lower epitaxial channel region over a bottom surface of the recess, and epitaxially growing an upper epitaxial channel region over a top surface of the lower epitaxial channel region. The upper or lower epitaxial channel region comprises germanium-tin (Ge$_{1-x}$Sn$_x$), silicon-germanium (Si$_{1-x}$Ge$_x$), or carbon-doped silicon-germanium (Si$_{1-x}$Ge$_x$C$_y$), and wherein x and y are in a range of about 0 to about 1.

While method 600 has been described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate comprising an active region;
source/drain regions arranged in the active region;
a replacement channel region arranged laterally between the source/drain regions, the replacement channel region comprising an upper epitaxial channel region of silicon (Si) and a lower epitaxial channel region, wherein the lower epitaxial channel region includes a to lower epitaxial channel layer, a middle lower epitaxial channel layer, and a bottom lower epitaxial channel layer, wherein the top lower epitaxial channel layer and the bottom lower epitaxial channel layer each comprise a first material and the middle lower epitaxial channel layer comprises a second material that is different from the first material, wherein the first material comprises germanium-tin ($Ge_i Sn_x$), silicon-germanium ($Si_{1-x}Ge_x$), carbon-doped silicon-germanium, silicon-carbide, phosphorus-doped silicon-carbide, or silicon-boride (SiB), wherein x is in a range of greater than 0 and less than 1; and
a gate structure arranged over the replacement channel region, the gate structure including a conductive gate electrode and a gate dielectric, which separates the gate conductive electrode from the replacement channel region.

2. The semiconductor device of claim 1, wherein the top lower epitaxial channel layer comprises $Si_{1-x}Ge_x$, formed over the middle lower epitaxial channel layer comprising carbon-doped silicon-germanium or silicon-carbide (SiC), formed over the bottom lower epitaxial channel layer comprising $Si_i Ge_x$.

3. The semiconductor device of claim 1, wherein the top lower epitaxial channel layer comprises silicon-carbide, formed over the middle lower epitaxial channel layer comprising SiB with boron concentration of less than $5e19 cm^{-3}$, formed over the bottom lower epitaxial channel layer comprising silicon-carbide.

4. The semiconductor device of claim 1, wherein the top lower epitaxial channel layer comprises silicon-carbide, formed over the middle lower epitaxial channel layer comprising phosphorus-doped silicon-carbide with phosphorus concentration of less than $5e19 cm^{-3}$, formed over the bottom lower epitaxial channel layer comprising silicon-carbide.

5. A semiconductor device, comprising:
a semiconductor substrate comprising an active region having a first conductivity type;
source/drain regions having a second conductivity type arranged in the active region;
a replacement channel region arranged laterally between the source/drain regions, the replacement channel region comprising an upper epitaxial channel region and a lower epitaxial channel region, which comprises a different material than the upper epitaxial channel region, wherein the upper and lower epitaxial channel regions collectively comprise a first epitaxial channel layer comprising germanium (Ge) and a second epitaxial channel layer comprising germanium-tin ($Ge_{1-x}Sn_x$), and wherein x is in a range of greater than 0 to less than 1; and
a gate structure arranged over the replacement channel region, the gate structure including a conductive gate electrode and a gate dielectric, which separates the conductive electrode from the replacement channel region.

6. The semiconductor device of claim 5, wherein the upper epitaxial channel region comprises a single layer of germanium-tin ($Ge_i Sn_x$), and wherein x is in a range of about 0.1 to about 0.5.

7. The semiconductor device of claim 5, wherein charge carriers within the upper epitaxial channel region have an effective mass ($m^*/m_e$) of about 0.044 ($m_e = 9.11 \times 10^{-31}$ kg).

8. The semiconductor device of claim 5, wherein the lower epitaxial channel region comprises a Ge layer.

9. The semiconductor device of claim 5, further comprising a strain-relaxing layer formed below the lower epitaxial channel region and above a surface of the substrate, wherein the strain-relaxing layer has a lattice constant value that is less than a lattice constant value of the substrate and greater than a lattice constant value of the lower epitaxial channel region, or vice versa.

10. The semiconductor device of claim 9, wherein the strain-relaxing layer comprises Ge, silicon (Si), or $Si_{1-x}Ge_x$.

11. A semiconductor device, comprising:
a semiconductor substrate comprising an active region having a first conductivity type;
first and second source/drain regions arranged in the active region and having a second conductivity type which is opposite the first conductivity type;
a replacement channel region arranged laterally between the source/drain regions, the replacement channel region comprising an upper epitaxial channel region and a lower epitaxial channel region having different compositions from one another, the lower epitaxial channel region being made of $Ge_{1-x}Sn_x$, $Si_{1-x}Ge_x$, or carbon-doped silicon-germanium, wherein x is less than or equal to 0.10 and greater than 0;
a strain relaxing layer of Ge or Si disposed between the replacement channel region and the semiconductor substrate, wherein the lower epitaxial channel region is configured to retard dopant diffusion from the upper epitaxial channel region towards the strain-relaxing layer; and
a gate structure arranged over the replacement channel region, the gate structure including a conductive gate electrode and a gate dielectric, which separates the conductive electrode from the replacement channel region.

12. The semiconductor device of claim 11, wherein the strain-relaxing layer has a lattice constant value that is less than a lattice constant value of the substrate and greater than a lattice constant value of the lower epitaxial channel region, or vice versa.

13. The semiconductor device of claim 11, wherein the upper epitaxial channel region comprises silicon with a peak doping concentration of about 1e19cm$^{-3}$.

14. The semiconductor device of claim 13, wherein a doping concentration at a top surface of the upper epitaxial channel region and the gate dielectric is less than 1e18 cm$^{-3}$.

15. The semiconductor device of claim 13, wherein the upper epitaxial channel region exhibits an absence of germanium.

16. The semiconductor device of claim 11, wherein the upper epitaxial channel region comprises a single layer of germanium-tin (Ge$_{i-x}$Sn$_x$).

17. The semiconductor device of claim 11, wherein the upper epitaxial channel region comprises a top upper epitaxial channel layer comprising germanium (Ge) formed over a bottom upper epitaxial channel layer comprising Ge$_{i-x}$Sn$_x$.

* * * * *

UNITED STATES PATENT AND TRADEMARK OFFICE
CERTIFICATE OF CORRECTION

PATENT NO. : 9,525,031 B2
APPLICATION NO. : 14/208353
DATED : December 20, 2016
INVENTOR(S) : Tsung-Hsing Yu et al.

It is certified that error appears in the above-identified patent and that said Letters Patent is hereby corrected as shown below:

Column 9, Claim 1, Line 28, please change "region includes a to" to --region includes a top--

Column 9, Claim 1, Lines 36-37, please change "germanium-tin ($Ge_i Sn_x$), silicon-germanium ($Si_{i-x}Ge_x$)," to --germanium-tin ($Ge_{1-x}Sn_x$), silicon-germanium ($Si_{1-x}Ge_x$),--

Column 9, Claim 2, Lines 50-51, please change "layer comprising $Si_i Ge_x$" to --layer comprising $Si_{1-x}Ge_x$--

Column 10, Claim 5, Lines 11-13, please change "germanium-tin ($Ge_{i-x}Sn_x$), and wherein x is in a range of greater than 0to less than 1; and" to --germanium-tin ($Ge_{1-x}Sn_x$), and wherein x is in a range of greater than 0 to less than 1; and--

Column 10, Claim 6, Line 21, please change "germanium-tin ($Ge_i Sn_x$)," to --germanium-tin ($Ge_{1-x}Sn_x$),--

Column 10, Claim 10, Line 37, please change "or ($Si_{i-x} Ge_x$)." to --or ($Si_{1-x}Ge_x$).--

Column 10, Claim 11, Line 49, please change "$Ge_{i-x}Sn_x$, $Si_{i-x}Ge_x$," to --$Ge_{1-x}Sn_x$, $Si_{1-x}Ge_x$,--

Column 11, Claim 16, Line 12, please change "$Ge_{i-x}Sn_x$" to --$Ge_{1-x}Sn_x$--

Column 11, Claim 17, Line 17, please change "$Ge_{i-x}Sn_x$" to --$Ge_{1-x}Sn_x$--

Signed and Sealed this
Twenty-eighth Day of February, 2017

Michelle K. Lee
*Director of the United States Patent and Trademark Office*